(12) United States Patent
Munoz et al.

(10) Patent No.: US 6,376,910 B1
(45) Date of Patent: Apr. 23, 2002

(54) SOLDER-ON BACK METAL FOR SEMICONDUCTOR DIE

(75) Inventors: Jorge Munoz, Cypress; Chuan Cheah, El Segundo, both of CA (US)

(73) Assignee: International Rectifier Corporation, El Segundo, CA (US)

(*) Notice: Subject to any disclaimer, the term of this patent is extended or adjusted under 35 U.S.C. 154(b) by 0 days.

(21) Appl. No.: 09/361,633

(22) Filed: Jun. 23, 1999

(51) Int. Cl.[7] ................ H01L 23/48; H01L 23/52; H01L 29/40
(52) U.S. Cl. .............. 257/741; 257/750; 257/762; 257/763; 257/764
(58) Field of Search ............... 257/736, 750, 257/762, 763, 764, 770; 438/650, 652, 686, 687, 648, 656, 683, 685, 649

(56) References Cited

U.S. PATENT DOCUMENTS

| 5,048,744 A | * | 9/1991 | Chang et al. ............ 228/123 |
| 5,442,239 A | * | 8/1995 | DiGiacomo et al. ........ 257/781 |
| 5,635,764 A | * | 6/1997 | Fujikawa et al. ............ 257/766 |
| 5,796,168 A | * | 8/1998 | Datta et al. ................. 257/781 |
| 5,945,732 A | * | 8/1999 | Burns ........................ 257/674 |
| 6,097,081 A | * | 8/2000 | Masuda et al. ............. 257/666 |
| 6,166,441 A | * | 12/2000 | Geryk ........................ 257/773 |

FOREIGN PATENT DOCUMENTS

| JP | 58-101432 | * | 6/1983 | ................. 257/779 |
| JP | 3-208355 | * | 9/1991 | ................. 438/102 |

* cited by examiner

Primary Examiner—Jhihan B Clark
(74) Attorney, Agent, or Firm—Ostrolenk, Faber, Gerb & Soffen, LLP

(57) ABSTRACT

A solderable back contact for semiconductor die consists of a titanium layer bonded to the bottom of the die. The free surface of the titanium layer is coated with a copper layer. A soft solder layer joins the bottom of the die to a copper lead frame by first heating the die to below the melting point of the solder, and then ultrasonically "scrubbing" the solder to cause it to bond to the die and lead frame with a minimum sized solder fillet.

19 Claims, 2 Drawing Sheets

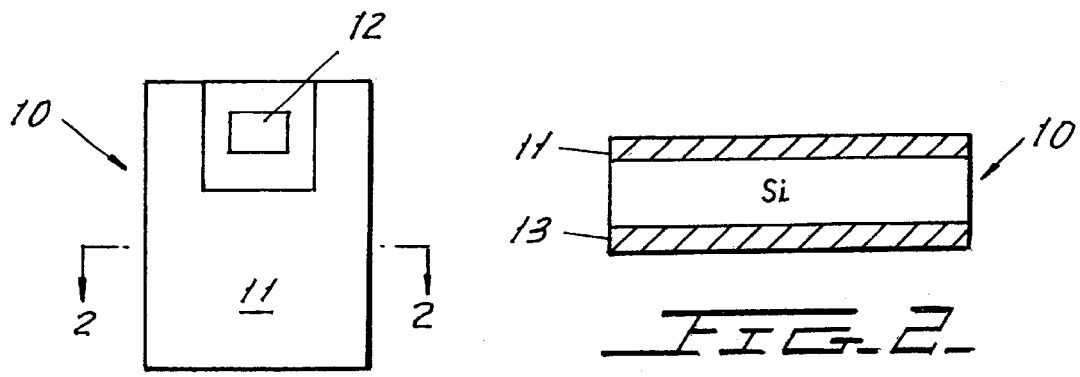
FIG. 1.
FIG. 2.
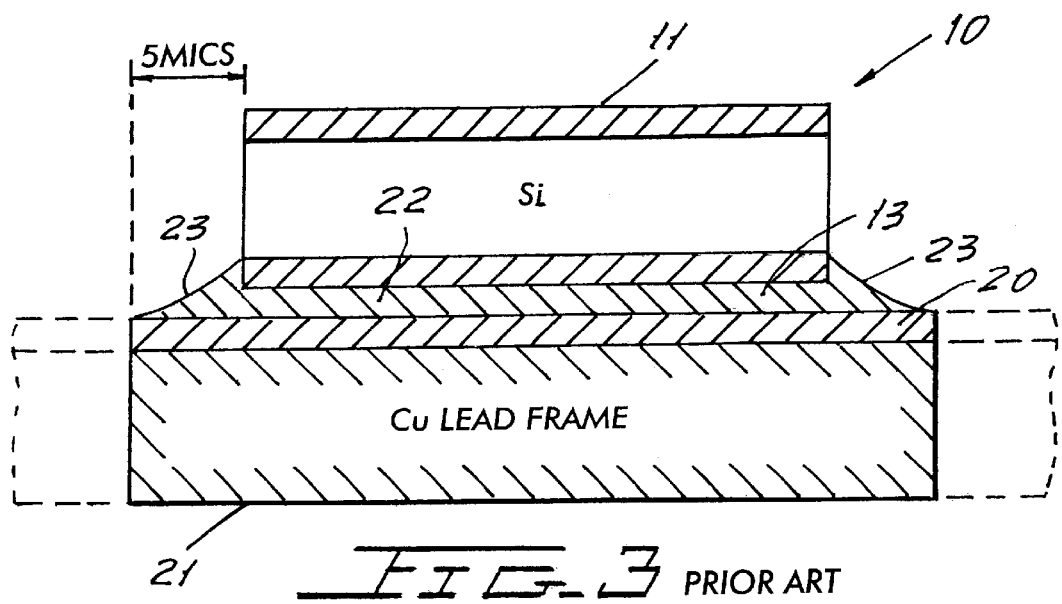
FIG. 3 PRIOR ART
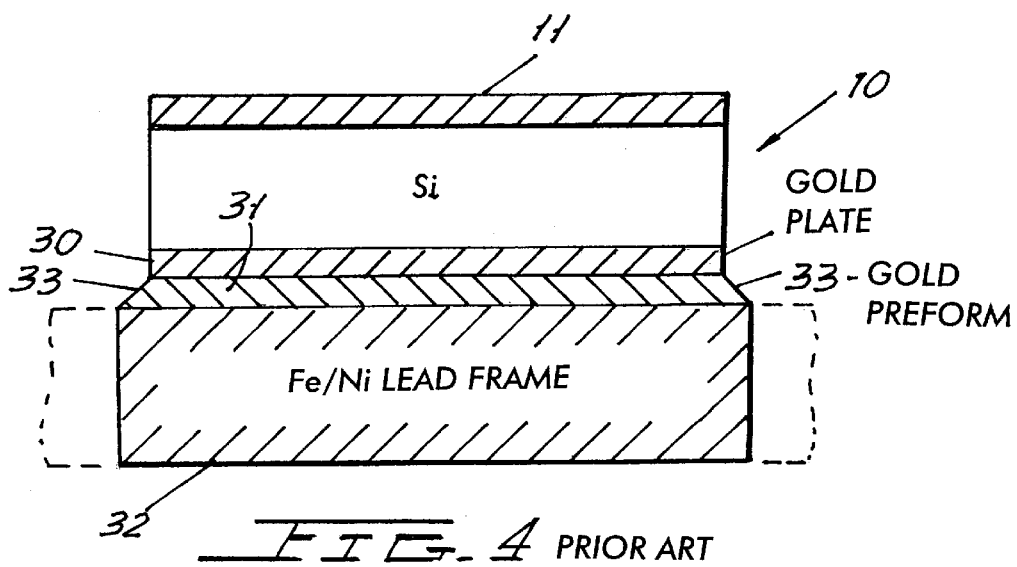
FIG. 4 PRIOR ART

US 6,376,910 B1

SOLDER-ON BACK METAL FOR SEMICONDUCTOR DIE

BACKGROUND OF THE INVENTION

The present invention relates to semiconductor devices and more specifically relates to a novel structure and process for connecting a semiconductor die to a conductive support.

Semiconductors devices such as MOSFETs, bipolar transistors, thyristors, diodes and the like are manufactured as elements of a larger wafer which permits the simultaneous formation of the necessary junctions and metalizations of the die which are later separated from the wafer. After the die are separated they are usually mounted on respective heat sink supports, typically the central "paddle" portions of a conductive lead frame, and are then housed within a suitable protective housing.

A common prior art technique is to use a soft solder perform to connect the bottom electrode of the die to a low-cost copper lead frame. The assembly is then heated above the melting temperature of the perform and the solder flows to connect the die to the lead frame. At the same time, a solder fillet, which may be 5 mils wide is also formed around the periphery of the die. Thus, the lead frame element must be larger in area than the die to accept this fillet. Consequently, the ultimate package size is also increased.

It is known that ultrasonic bonding, or "scrubbing" can be used to connect the die to a lead frame, and that this process minimizes the width of the solder fillet. In the scrub operation, the solder chosen is heated below its melting point and ultrasonic energy, causing the "scrubbing" (or friction) causes the ultimate wetting and adhesion of the solder to the die and the lead frame.

When the scrub process is used, the die is provided with a sputtered gold layer, and a gold perform solder is used between the die and lead frame. It is then necessary to heat the gold and the gold-silicon eutectic to about 380° C. and then scrub at about 400° C. This process is useful in forming short solder fillets (since the solder does not flow readily). However, the higher temperatures needed prevent the use of the conventional copper lead frame, and a more expensive nickel-iron alloy lead frame is necessary. Further, the gold solder is a "hard" solder which can fail during thermal cycling due to the mismatch in the thermal expansion characteristics of the gold, silicon and nickel-iron lead frame. Thus, the scrub process has been used principally for very small die.

Finally, gold is very undesirable in most semiconductor device fabrication facilities because even very small amounts of gold atoms which may be released into the fabrication area can contaminate the wafers being processed.

BRIEF DESCRIPTION OF THE INVENTION

The present invention provides a novel solder-on back metal for semiconductor die which is connectable to a conventional copper lead frame by a relatively low temperature scrub process, and which avoids gold in the solder or system. More specifically, the back of the die carries a titanium layer (which can be applied by sputtering) which is then covered by a thin copper layer, and then by an easily scrubbable thick layer of soft solder such as a lead/tin solder.

The soft solder surface of the die is then placed atop a conventional copper lead frame and ultrasonic energy is conventionally applied to cause the "scrubbing" action which attaches the die to the lead frame at just below the melting point of the solder (300° C.) with only a very small solder fillet.

The novel lower temperature process permits the use of standard copper lead frames and permits the use of a die area almost as large as the lead frame area, thus reducing the package size compared to one using the conventional solder process in which the solder is heated above its melting point and flows readily. Further, the process of the invention is carried out without the use of gold-containing solders.

While the invention is particularly useful for ultrasonic bonding, it should be noted that the solder-on back metal can easily be soldered to any conductor in any other manner.

BRIEF DESCRIPTION OF THE DRAWINGS

FIG. 1 is a top view of a typical semiconductor device die which can be provided with the solder-on back contact of the inventions.

FIG. 2 is a cross-section of FIG. 1 taken across section line 2—2 in FIG. 1.

FIG. 3 is a cross-section of structures soldered together by a first prior art solder method which produces a large solder fillet.

FIG. 4 is a cross-section like FIG. 3, but with a prior art securement method, using gold solder.

DETAILED DESCRIPTION OF THE DRAWINGS

Figure 5:
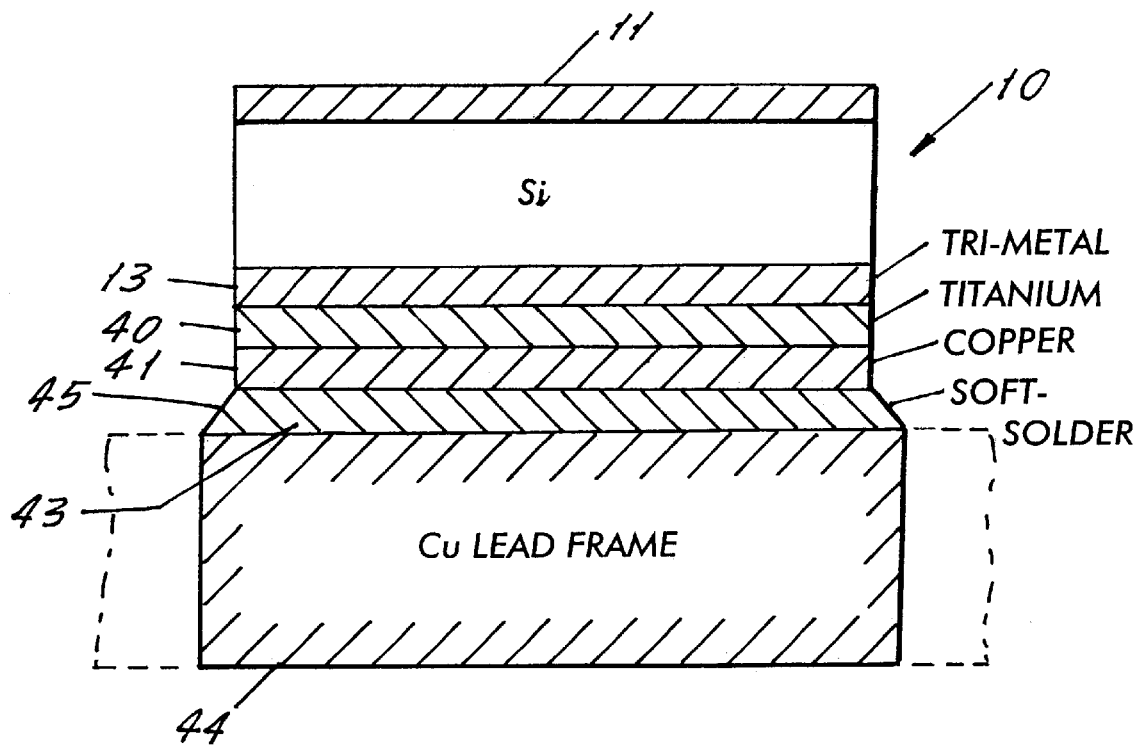
FIG. 5 shows a cross-section of a device made by the process of the present invention.

FIGS. 1 and 2 show a typical semiconductor die 10 which is a MOSFET of the type shown for example, in U.S. Pat. No. 5,008,725. Thus, silicon die 10 will have a top source electrode 11, usually of aluminum, and a gate control electrode 12. The bottom or drain electrode 13 is usually a tri-metal such as TiNiAg or the like. Note that the present invention is not limited to use with MOSFET die and is applicable to any structure in which a die of any kind is to be connected to a conductive support of only very slightly larger dimensions than the die, and with a minimized solder fillet.

FIG. 3 is a cross-section showing a prior art connection of die 10 to the paddle section 20 of a conventional copper lead frame. The lead frame paddle 20 is sometimes plated with a nickel layer 21, or the like. A soft solder wafer 22 is placed between the bottom of die 10 and the top of lead frame 21 and the system is heated above the reflow temperature of solder 22. The solder 22 melts and forms fillet 23 which may be 5 mils wide when the solder is solidified. Thus, the lead frame 21 and the final package must be increased in area to accommodate this fillet.

FIG. 4 shows a prior art structure which has been made by a process which avoids the large fillet 23, at the cost however of very expensive solder and lead frame materials. Thus, in FIG. 4, die 10 is processed without the bottom trimetal 13, and, in its place, it contains a sputtered gold plate layer (a gold-silicon eutectic) 30. A gold preform 31, which may be 10,000 Å thick is then inserted between the die 10 and lead frame 32. Lead frame 32 is a nickel-iron alloy frame, needed in place of the less expensive copper lead frame 21 of FIG. 3 because it will be exposed to higher die connection temperatures.

Thus, to secure die 10 to lead frame 32, the die must first be heated to about 380° C. Ultrasonic scrubbing energy is then applied to the gold preform 31 to scrub at above about 400° C. which is the eutectic point of the gold and gold-silicon eutectic. The solder then joins die 10 to lead frame 32 with a reduced size fillet 33, which is about 1 mil in width around the die. Accordingly, the lead frame 32 and the final package can be smaller then that made by the process of FIG. 3. However, this is at the expense of the gold materials and the more expensive high temperature lead frame 32, and the danger of introducing gold into the fabrication facility.

FIG. 5 shows the die 10 which is provided with the novel solder-on back metal contact of the invention. Thus, in FIG. 5, the bottom of die 10 has a titanium layer 40 formed thereon, as by sputtering (when the die is in the wafer state), to a thickness of about 1000 Å. Thereafter, a few microns of copper is formed on the free surface of titanium layer 40 by sputtering. A thicker layer of copper 41 is formed on the sputtered seed copper as by electroplating, to a thickness of about 1000 Å. Finally, a conventional soft solder layer 43 for example a lead/tin solder (90%/10%) coats the copper layer 41. Solder layer 43 has a thickness of 1 to 3 mils.

The lead frame 44 which receives the die 10 in FIG. 5 may be a conventional copper lead frame, which, as will be later described has a smaller area than that of FIG. 3 and has the area of the nickel-iron lead frame 32 in FIG. 4 for the same die size.

In order to secure die 10 to lead frame 44 in FIG. 5, an ultrasonic bonding operation is carried out in which the die 10 is heated to below about 300° C. (the melting point of solder 32). Ultrasonic or scrubbing energy is then applied to the solder to cause it to attach the parts by "scrubbing". The scrubbing operation produce a very small solder fillet 45 as in FIG. 4. Consequently, the lead frame paddle 44 in FIG. 5 need be only about one-mil larger, at each die side, than the die 10, thus producing a reduced size package for a given die size. Further, the novel back contact avoids the need for gold in the process and uses a soft solder for improved thermal cycling performance and enables the use of standard copper lead frames.

Figure 6:
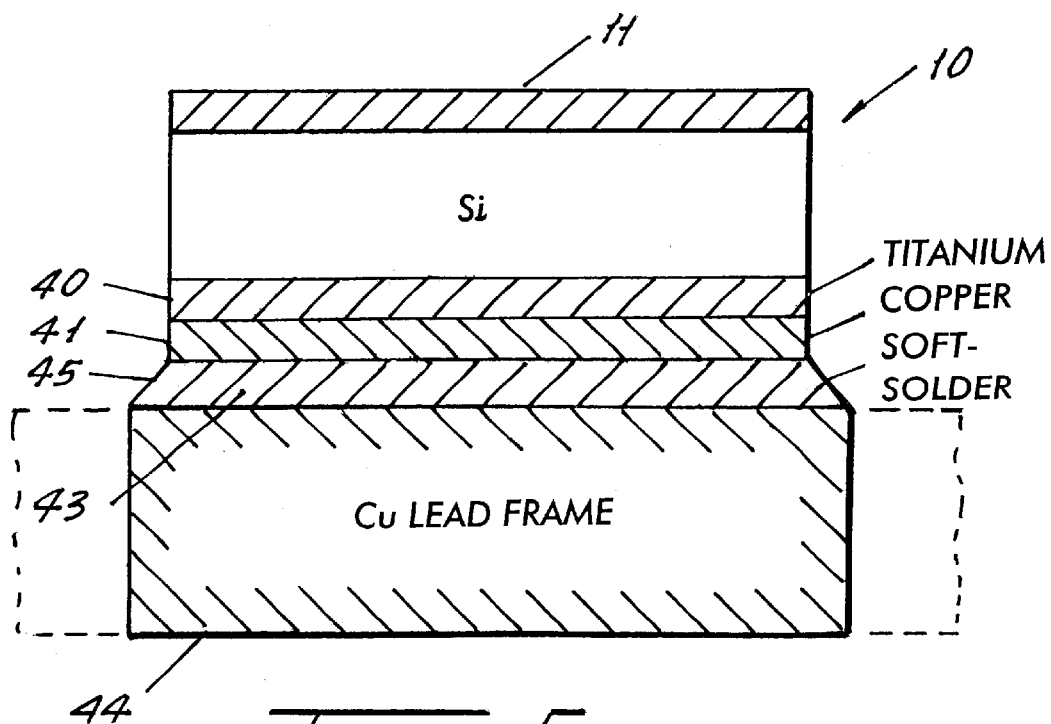
FIG. 6 is a cross-section like that of FIG. 5 and showing a second embodiment of the invention.

FIG. 5 shows the invention for a die 10 which has the conventional trimetal contact or electrode 13 in place. The trimetal, however, can be dispensed with, and titanium layer 40 can be directly connected to the silicon die as shown in FIG. 6, which is otherwise identical to FIG. 5.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A silicon die having a solder-on back metal;
   said silicon die having first and second parallel surfaces spaced from one another by the thickness of said die;
   at least a portion of said first surface having a first conductive electrode thereon;
   said second surface having a solderable electrode thereon;
   said solderable electrode comprising a layer of titanium metal in contact with said second surface, a layer of copper formed on the outer free surface of said titanium layer and a soft solder layer formed on the outer free surface of said copper layer; wherein a minimum width solder fillet is formed around the periphery of said die when said die and a lead frame element are secured together by ultrasonic bonding.

2. The device of claim 1 wherein said solderable electrode is adapted to be solderable to a flat copper lead frame support element by ultrasonic bonding.

3. The device of claim 1 wherein said titanium layer has a thickness of about 1000 Å.

4. The device of claim 1 wherein said soft solder layer is a lead-tin solder system.

5. The device of claim 2 wherein said titanium layer has a thickness of about 1000 Å.

6. The device of claim 2 wherein said soft solder layer is a lead-tin solder system.

7. A semiconductor device comprising a silicon die supported on and electrically connected to a lead frame element;
   silicon die having a solder-on back metal;
   said silicon die having first and second parallel surfaces spaced from one another by the thickness of said die;
   at least a portion of said first surface having a first conductive electrode thereon;
   said second surface having a solderable electrode thereon;
   said solderable electrode comprising a layer of titanium metal in contact with said second surface, a layer of copper formed on the outer free surface of said titanium layer and a soft solder layer formed on the outer free surface of said copper layer;
   said lead frame element comprising a portion of a flat copper lead frame; said die being fixed to said lead frame by an ultrasonic scrubbing operation; wherein a minimum width solder fillet is formed around the periphery of said die when said die and said lead frame element are secured together by ultrasonic bonding.

8. The device of claim 7 wherein said titanium layer has a thickness of about 1000 Å.

9. The device of claim 7 wherein said soft solder layer is a lead-tin solder system.

10. The device of claim 7 wherein said soft solder layer is a lead-tin solder system.

11. The device of claim 8 wherein said soft solder layer is a lead-tin solder system.

12. The device of claim 11 wherein said soft solder layer is a lead-tin solder system and wherein a minimum width solder fillet is formed around the periphery of said die when said die and lead frame element are secured together by ultrasonic bonding.

13. The device of claim 12 wherein said die is secured by scrubbing to said lead frame element at a temperature which is lower than the melting temperature of said soft solder.

14. A scrubbable back metal for silicon die surface comprising a layer of titanium metal in contact with said surface, a layer of copper formed on the outer free surface of said titanium layer and a soft solder layer formed on the outer free surface of said copper layer; wherein said titanium layer has a thickness of about 1000 Å.

15. The device of claim 14 wherein said soft solder layer is a lead-tin solder system.

16. The device of claim 14 wherein said soft solder layer is a lead-tin solder system.

17. The device of claim 14, wherein said soft solder layer has a thickness of 1–3 mils.

18. A scrubbable back metal for silicon die surface comprising:
   a layer of titanium metal in contact with said die surface,
   a layer of copper formed on the outer free surface of said titanium layer and
   a soft solder layer formed on the outer free surface of said copper layer, wherein the copper and titanium layers are flush with each other; wherein said solder layer has a thickness of 1–3 mils.

19. The scrubbable back metal of claim 18, wherein said titanium layer has a thickness of 1000 Å.

* * * * *